United States Patent

Gruenenfelder et al.

[11] Patent Number: 5,833,823
[45] Date of Patent: *Nov. 10, 1998

[54] SPUTTER SOURCE WITH A TARGET ARRANGEMENT AND A HOLDING DEVICE

[75] Inventors: Pius Gruenenfelder, Buelweg, Switzerland; Peter Buechel, Balzers, Liechtenstein; Klaus Leitner, Feldkirch-Nofels, Austria; Walter Haag, Grabs, Switzerland

[73] Assignee: Balzers Aktiengesellschaft, Liechtenstein

[ * ] Notice: This patent issued on a continued prosecution application filed under 37 CFR 1.53(d), and is subject to the twenty year patent term provisions of 35 U.S.C. 154(a)(2).

[21] Appl. No.: 559,883

[22] Filed: Nov. 20, 1995

Related U.S. Application Data

[63] Continuation of Ser. No. 322,912, Oct. 13, 1994, abandoned.

[30] Foreign Application Priority Data

Oct. 13, 1993 [CH] Switzerland .................... 03 083/93-7

[51] Int. Cl.⁶ .................................................. C23C 14/34
[52] U.S. Cl. .............................. 204/298.09; 204/192.12; 204/298.12
[58] Field of Search ....................... 204/192.12, 298.09, 204/298.12

[56] References Cited

U.S. PATENT DOCUMENTS

| 5,066,381 | 11/1991 | Ohta et al. | 204/298.12 |
| 5,071,535 | 12/1991 | Hartig et al. | 204/298.09 |
| 5,269,894 | 12/1993 | Kerschbaumer | 204/192.12 |

FOREIGN PATENT DOCUMENTS

| 132761 | 5/1989 | Japan . |
| 285068 | 11/1990 | Japan . |

*Primary Examiner*—Nam Nguyen
*Attorney, Agent, or Firm*—Evenson, McKeown, Edwards & Lenahan, P.L.L.C.

[57] ABSTRACT

A sputter source and a corresponding target and holding device are provided in which the target is held by form locking arrangements. The target is pushed in an x-direction in the manner of a sliding drawer and is fixed by a releasable lock. A foil, which defines a cooling system on the holding device side, braces the fixed target when the cooling system is acted upon by pressure.

7 Claims, 2 Drawing Sheets

SPUTTER SOURCE WITH A TARGET ARRANGEMENT AND A HOLDING DEVICE

This is a continuation of application Ser. No. 08/322,912, filed on Oct. 13, 1994 abandoned.

BACKGROUND AND SUMMARY OF THE INVENTION

The present invention relates to a sputter source comprising a target arrangement and a holding device, and more particularly, to a target arrangement having at least two target plates as well as a sputter source without any target arrangement but for receiving a target arrangement of the aforementioned type.

German Patent DE-A-33 03 241 describes a sputter source which is an essentially rectangular target arrangement mounted on a holding device which comprises a cooling plate as a support. The fastening of the target arrangement takes place by a center strip, which is accessible from the direction of the target atomization surface, and by lateral clamping strips. The provision of holding parts which are exposed on the atomization surface of the target arrangement (that is, the process side), particularly of the center strip, on this known sputter source is possible because the main erosion zone during sputtering is situated essentially on an annular track. There is almost no atomizing or sputtering outside and inside this track.

German Patent DE-A-3 620 908 also describes a multipart target arrangement which has recesses for the insertion of a holding body.

German Patent DE-A-3 519 907 describes a round target which has cylindrical recesses on the back for receiving a form-locking part of the holding device. In the case of a sputter source according to German Patent DE 36 03 646, the holding device comprises cooled clamps for the fastening of the target arrangement. Screwed-on target holding devices with sealing element in the center of the target arrangement are also known.

European Patent EP-A 0 499 770 and German Patent DE-A 42 23 091 describe the use of a bayonet catch or a sliding guide connection. The former are limited to operability from above; whereas the latter do not secure an exact positioning of the target arrangement. Furthermore, ball catch closures for target arrangements are known from WO 92/20831.

It is an object of the present invention to provide a sputter source in which the target arrangement can be exchanged by way of a few manipulations and can be precisely positioned with respect to the impact, and low manufacturing expenditures are achieved This has been achieved by providing a sputter source in which projections and recesses are arranged at the target arrangement as well as at the holding device to engage one another in one direction (y-direction) in a form-locking manner perpendicularly to a target source when the target arrangement and holding device are substantially linearly moved relative to one another parallel to the target source in another direction (x-direction), and at least one releasable lock is provided at the holding device to lock against the relative movement between the target arrangement and the holding device.

As the result of the configuration of the target arrangement, which may be a one-piece target plate as well as a so-called composite target plate which is undetachably fastened on a stabilizing plate, sliding of the target arrangement is made possible in a simple manner into the holding device, whereby its fixation is set perpendicularly to the atomization surface of the target arrangement. By setting up the releasable lock, the positioning of the target arrangement in its desired position also takes place in a simple manner The target arrangement will then be situated in all directions in parallel to its atomization surface with respect to the impact and is held in a form-locking manner in the atomization direction.

Because the sputter source is constructed so that the target arrangement has a plate-shaped construction and no parts of the holding device project, as viewed from the top, beyond the periphery of at least one target plate, the target arrangement can be atomized thereon along the entire atomization surface without the danger that holding elements are also atomized.

According to a preferred embodiment of the sputter source, the projections and recesses on the holding device extend along a peripheral area of the target arrangement and are configured onto a strip arrangement projecting upwardly in a partial frame-like manner on the holding device, and the at least one released lock is arranged in the another direction (x-direction) opposite the peripheral area and comprises a detachable strip arrangement which, along with the partial-frame-type strip arrangement, engages target arrangement. This results, in addition to constructional simplicity particularly because of the partial-frame-type upward-projecting strip arrangement, in the lock of the partial-frame-type upward-projecting strip arrangement being provided in an opposite and detachable manner, and of ensuring that the target arrangement is easily brought into the desired position, for example, by a drawer-type pushing or sliding into the partial-frame-type upward projecting strip arrangement According to another advantageous aspect of the present invention, along a contact area for the target arrangement, at least in sections, a foil is operatively arranged, on the side of the holding device, to comprise a cooling system, and, by one of admitting pressure to the cooling system or relieving the system of pressure, reinforcing positive locking which is at least partly established by the at least one releasable lock. On the one hand, this ensures an optimal heat transfer between the cooling medium system and the target arrangement. In addition, the foil, which also defines the cooling medium system, has a tensioning effect because of the pressurized cooling medium in the system, whereby the target arrangement/holding device connection can be braced or released.

In view of the provision of a portion of projections and recesses on the underside of the target arrangement or the contact surface of the holding device, it is easily possible, preferably for supplementing the holding device of the target arrangement in the peripheral area, to hold the target arrangement also along its underside, that is, along its contact surface against the holding device, there normally formed by the cooling plate.

A target arrangement for a sputter source according to the present invention is further characterized by the target arrangement having the target arrangement has at least two target plates in which the projections and recesses are arranged such that the target plates can be alternately slid in for forming a large-surface target arrangement.

Furthermore, a sputter source according to the present invention is suitable for receiving and holding the above described target arrangement in order to form in an assembled condition a sputter source with the target arrangement mentioned at the outset.

BRIEF DESCRIPTION OF THE DRAWINGS

These and other objects, features and advantages of the present invention will become more readily apparent from the following detailed description thereof when taken in conjunction with the accompanying drawings wherein.

DETAILED DESCRIPTION OF THE DRAWINGS

Figure 1:
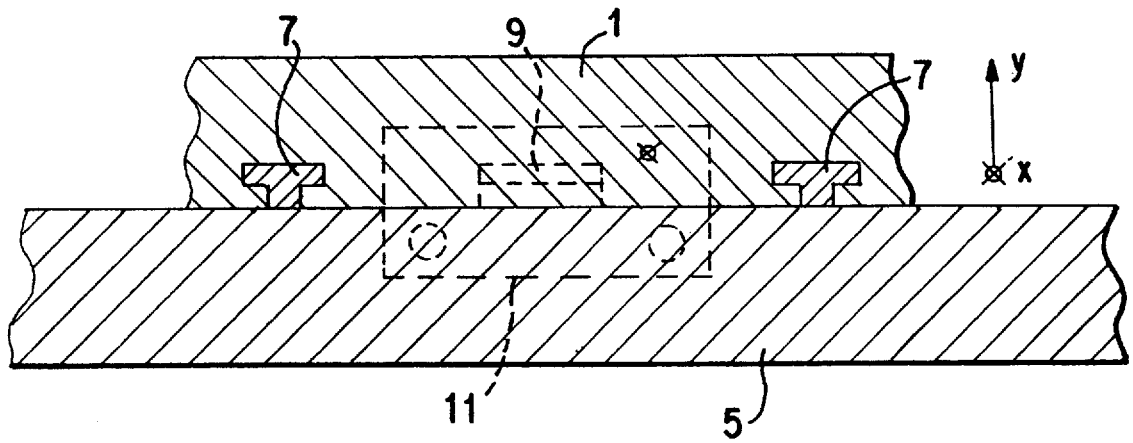
FIG. 1 is a schematic cross-sectional view of a cut-out from a sputter source with the target arrangement and the holding device according to the present invention.

A target arrangement 1, as seen in FIG. 1, can be a so-called composite target plate with a reinforcing back plate or a one-piece block target plate. The target arrangement 1 is mounted on a holding plate 5 which normally is a cooling plate. For this purpose, recesses 7 on the holding device 5 are arranged and extend in an x-direction and engage in correspondingly shaped recesses in the target arrangement 1 in a groove and summit form locking manner. The target arrangement 1 is slid in in the x-direction whereby the recesses 7 hold the target arrangement 1 in a form-locking manner particularly in the y-direction. The target arrangement 1 is slid to the stop 9 transversely to the slide-in x-direction and is finally fixed by the providing of a releasable lock 11 which is situated opposite the stop 9. It is understood, of course, that the recesses and the projections on the target arrangement 1 and the holding device 5 can be exchanged without departing from the scope of the present invention. It is also important that the target arrangement 1 can be slid, for example, in the manner of a sliding drawer, into recesses/projections and be brought to a stop where it is locked.

Figure 2:
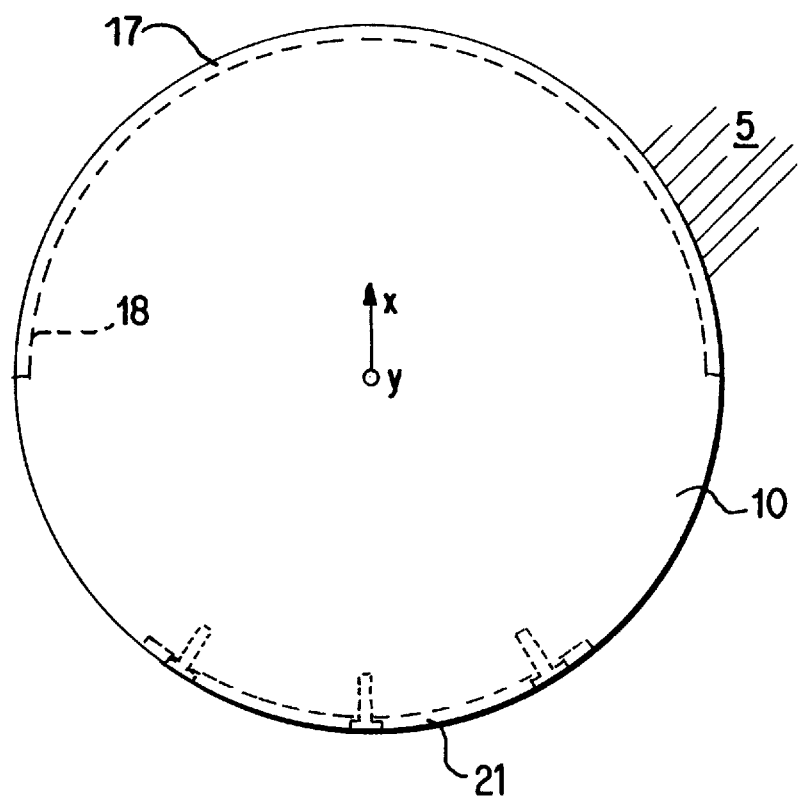
FIG. 2 is a schematic plan view of another embodiment of a sputter source according to the present invention with a round target arrangement.

A further embodiment of a circular target plate 10 is seen in FIG. 2. In this embodiment, a preferably upward-projecting, circular-segment-type strip arrangement 17 is provided in the manner of a partial frame on the holding plate 5. When the target arrangement 10 is slid in in the x-direction, the strip arrangement 17 engages in a form-locking manner in the y-direction in a recess 18 shaped correspondingly into the periphery of the plate 10. The partial frame 17 acts in this embodiment as lateral guides analogous to the recesses or elements 7 of FIG. 1 as well as a stop 9 according to the indicated figure. The releasable locking is implemented by providing the locking strip 21 which is screwed together, for example, with the holding plate 5. This embodiment is, as will now be readily apparent to one skilled in this art, suitable for all target forms. For a rectangular target arrangement, for example, the partial frame will be U- or V-shaped.

Figure 3:
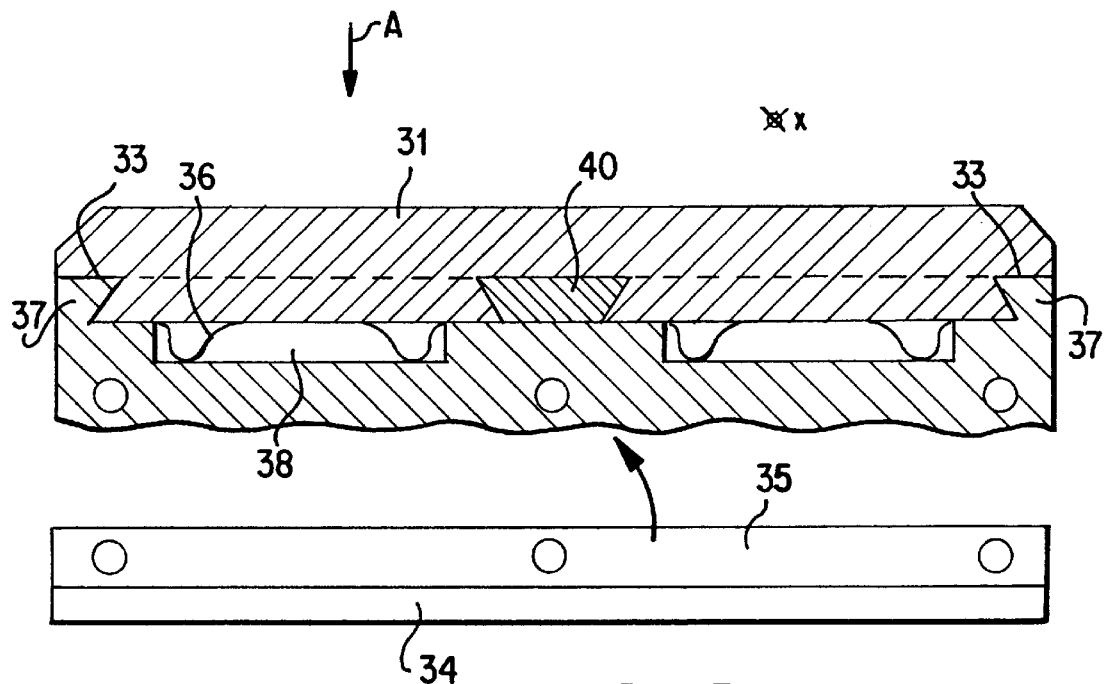
FIG. 3 is a currently preferred embodiment of a sputter source according to the present invention with the target according to the invention with or without the center holding device.

In a currently preferred embodiment of a sputter source according to the present invention shown in FIG. 3, the target arrangement 31, which is arranged is a composite target plate or a block target plate, has half-dovetailed recesses 33 preferably along its entire rectangular circumference. Correspondingly, an upward-projecting half-dovetailed profile strip arrangement 37 is provided on the holding device side on a cooling plate 35 in the area of the target arrangement periphery in a partial-frame-type U-shape. The releasable lock comprises an end strip 34 which completes the partial frame to a full frame and is screwed, for example, to the cooling plate 35.

The configuration of the peripheral projections/recesses is advantageously such that in view along a direction indicated by arrow A in FIG. 3 onto the atomization surface of the target arrangement 31, elements which are different from the target material, such as the profile strips 37, do not project laterally. Instead of the illustrated half-dovetailed profile of the strips 37 and of the recesses which are correspondingly indented on the target arrangement 31, other profiles, such as L-profiles or T-profiles may, of course, also be used without departing from the scope of the present invention.

If optimally short slide-in paths are desired, it is advantageous to construct another side of the profile strip arrangement in a releasable manner. By detaching the broad-side end strip 34 and, in addition, a longitudinal one 37, the rectangular target can be slid in corresponding to the profile depth via a diagonal, short path.

In the currently preferred embodiment, a foil 36, preferably a composite foil made of copper foil and tin foil, the latter being on the target arrangement side, with corresponding recesses on the cooling plate side, defines a cooling chamber system 38 which is acted upon with a cooling medium such as pressurized water. After the target arrangement 31 is slid into the partial frame 37 and the releasable locking is established by the end strip 34, the cooling chamber system 38 is pressurized, whereby the foil 36 is forced or moved against the back of the target arrangement 31. As a result, a good heat transfer is ensured, but the holding device of the target arrangement 31 is also braced. Alternatively, as illustrated by an interrupted line at reference numeral 39, cams or similar structures may be provided at the recesses/projections such that, as a result of the admission of pressure to the cooling chamber system 38, not only a bracing of the holding device takes place but also a form-locking engaging of structures acting in a form-locking manner in the x-direction to then form the releasable lock.

Figure 4:
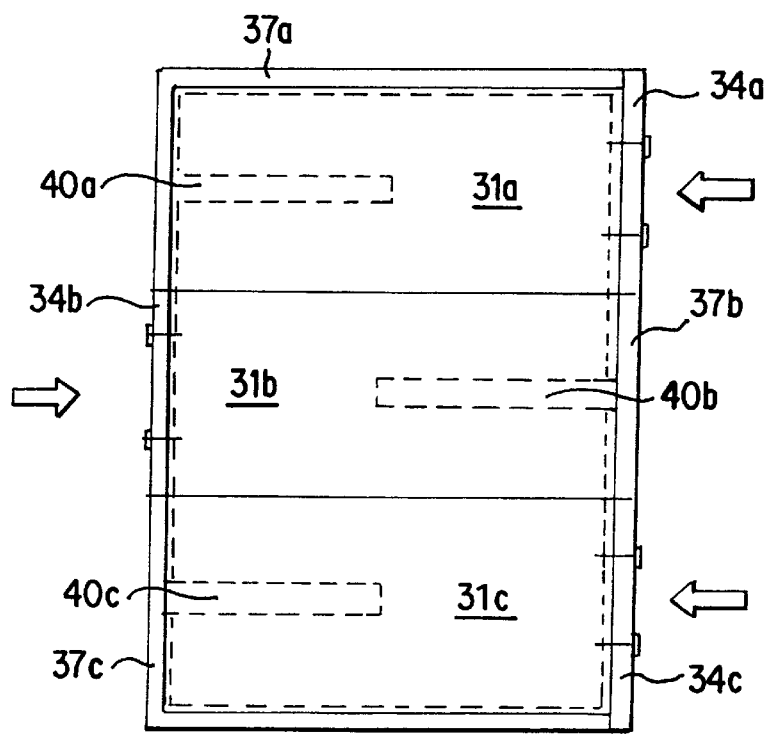
FIG. 4 is a plan view of target element plates lockingly arranged in fixed strips.

FIG. 3 further illustrates that, along the course of the back side of the target arrangement 31, several projection/recess arrangements 40 can also be provided in order to achieve a form-locking bracing, distributed over an area, in connection with larger target dimensions or less stiff target arrangement. According to FIG. 4, for large-surface targets, for example, in the case of magnet systems constructed in a meandering manner, target element plates 31a–31c may be pushed alternately into the fixed strip arrangements 37a–37c and may be locked by the releasable end strips 34a–34c.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A sputter source, comprising a target plate arrangement with a target plate and a back plate or with a one-piece bulk target plate, having a plate rear side surface;

a cooling arrangement with an upper surface comprising a cooling medium channel arrangement sealingly closed by a heat conductive foil at said upper surface, said target plate arrangement being removable from said cooling arrangement for replacement after consumption of target material;

a first mounting arrangement rigidly mounted to said cooling arrangement and comprising at least one of at least one projection and of at least one recess;

a second mounting arrangement rigidly mounted to said target plate arrangement and comprising at least one of at least one recess and of at least one projection;

said first and second mounting arrangement being slidingly interlockable in a form-locking manner, taken in a direction perpendicular to said plate rear side surface, as said target plate arrangement is slid along said plate rear side surface linearly and in a predetermined direction along and on an upper surface of said cooling arrangement;

a first abutment member defining an end of said linear sliding movement and being rigidly mounted to at least one of said target plate arrangement and of said cooling arrangement; and said first and second mounting arrangements being completely covered by target material of said target plate arrangement, wherein said target plate arrangement is configured to move from a slidingly interlockable position to a braced interlockable upon pressurization of the cooling medium channel and heat conductively biasing said foil towards and on the rear side surface.

2. The sputter source of claim 1, wherein one of said first and second mounting arrangements is substantially U-shaped.

3. The sputter source of claim 2, wherein one of said first and second mounting arrangements is formed by a projection, at least lateral leg sections of said U-shaped projection having a cross section according to an inverse L shape or a V shape, said second or first mounting arrangement having recesses at least along opposite lateral parts of a periphery thereof engagable with said leg sections of said U-shaped projection.

4. The sputter source of claim 2, wherein said U-shaped mounting arrangement is formed by a circular section.

5. The sputter source of claim 1, wherein said second mounting arrangement comprises said at least one recess or projection in a central area of said target plate arrangement.

6. The sputter source of claim 1, wherein one of said first and second mounting arrangement comprise respectively one of dove-tail and half dove-tail projections and recesses.

7. The sputter source of claim 1, wherein a second abutment is provided to prevent further movement of said target plate arrangement as the latter abuts on said first abutment member, said second abutment member being removably mounted at one of said target arrangement and of said cooling arrangement.

* * * * *